US012785724B2

(12) United States Patent
Coban et al.

(10) Patent No.: US 12,785,724 B2
(45) Date of Patent: Nov. 3, 2026

(54) ATTENUATOR HAVING EXTENDED ATTENUATION RANGE

(71) Applicant: Silicon Laboratories Inc., Austin, TX (US)

(72) Inventors: Abdulkerim Coban, Austin, TX (US); Mohamed Elkholy, Cedar Park, TX (US); Rangakrishnan Srinivasan, Austin, TX (US); Sherry Wu, Austin, TX (US); Yu Su, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 336 days.

(21) Appl. No.: 18/390,181

(22) Filed: Dec. 20, 2023

(65) Prior Publication Data

US 2025/0211259 A1 Jun. 26, 2025

(51) Int. Cl.
*H04B 1/00* (2006.01)
*H03F 3/19* (2006.01)
*H03H 7/24* (2006.01)

(52) U.S. Cl.
CPC ............. *H04B 1/0057* (2013.01); *H03F 3/19* (2013.01); *H03H 7/24* (2013.01); *H03F 2200/294* (2013.01); *H03F 2200/451* (2013.01)

(58) Field of Classification Search
CPC .......... H04B 1/0057; H04B 1/18; H03H 7/24; H03H 11/24; H03F 1/12
See application file for complete search history.

(56) References Cited

U.S. PATENT DOCUMENTS

| | | | |
|---|---|---|---|
| 5,095,533 | A | 3/1992 | Loper et al. |
| 5,734,683 | A | 3/1998 | Hulkko et al. |
| 5,777,494 | A | 7/1998 | Takahashi |
| 6,195,399 | B1 | 2/2001 | Dent et al. |
| 6,735,260 | B1 | 5/2004 | Eliezer et al. |
| 6,771,720 | B1 | 8/2004 | Yang et al. |
| 7,212,798 | B1 | 5/2007 | Adams et al. |
| 8,180,308 | B1 | 5/2012 | Neng et al. |
| 8,346,202 | B2 | 1/2013 | Coban et al. |
| 8,554,136 | B2 | 10/2013 | McCormack |
| 8,811,526 | B2 | 8/2014 | McCormack et al. |
| 8,912,785 | B2 | 12/2014 | Horvath |
| 9,172,344 | B2 | 10/2015 | Green et al. |

(Continued)

FOREIGN PATENT DOCUMENTS

WO 2013130486 A1 9/2013

OTHER PUBLICATIONS

U.S. Appl. No. 18/539,468, filed Dec. 14, 2023, by Rangakrishnan Srinivasan et al., entitled Gain Contol to Optimize Sensitivity and Blocking Performance, 33 pgs.

*Primary Examiner* — Ayodeji O Ayotunde
(74) *Attorney, Agent, or Firm* — Trop, Pruner & Hu, P.C.

(57) ABSTRACT

In one aspect, an apparatus includes: a first amplifier coupled to a first node of a receiver signal processing path, the first amplifier to receive and amplify a radio frequency (RF) signal; a first resistive attenuator coupled to the first node, the first resistive attenuator programmable to reduce a level of the RF signal; a second amplifier coupled in parallel with the first amplifier, the second amplifier to receive and amplify the RF signal; and a second attenuator coupled between the first node and the second amplifier, the second attenuator programmable to reduce the level of the RF signal.

20 Claims, 9 Drawing Sheets

(56) References Cited

U.S. PATENT DOCUMENTS

| | | | |
|---|---|---|---|
| 9,203,452 | B2 | 12/2015 | Li et al. |
| 9,322,904 | B2 | 4/2016 | McCormack et al. |
| 9,379,450 | B2 | 6/2016 | Kyles et al. |
| 9,407,311 | B2 | 8/2016 | McCormack et al. |
| 9,426,660 | B2 | 8/2016 | McCormack et al. |
| 9,444,523 | B2 | 9/2016 | McCormack et al. |
| 9,515,365 | B2 | 12/2016 | McCormack et al. |
| 9,515,859 | B2 | 12/2016 | McCormack et al. |
| 9,736,790 | B1 | 8/2017 | Haub et al. |
| 9,948,347 | B2 | 4/2018 | Milenkovic |
| 10,469,112 | B2 | 11/2019 | Coban |
| 2004/0190650 | A1 | 9/2004 | Khorram et al. |
| 2004/0196017 | A1 | 10/2004 | Sutardja et al. |
| 2005/0186910 | A1 | 8/2005 | Moorti et al. |
| 2005/0186917 | A1 | 8/2005 | Rofougaran et al. |
| 2007/0248192 | A1 | 10/2007 | Brunsch et al. |
| 2008/0160945 | A1 | 7/2008 | Crinon et al. |
| 2010/0026547 | A1 | 2/2010 | Weissman et al. |
| 2010/0153589 | A1 | 6/2010 | Maroni et al. |
| 2010/0172450 | A1 | 7/2010 | Komaili et al. |
| 2010/0246714 | A1 | 9/2010 | Yang et al. |
| 2011/0009080 | A1 | 1/2011 | Seendripu et al. |
| 2012/0121043 | A1 | 5/2012 | Wambacq |
| 2012/0249366 | A1 | 10/2012 | Pozgay et al. |
| 2012/0263244 | A1 | 10/2012 | Kyles et al. |
| 2012/0307932 | A1 | 12/2012 | McCormack et al. |
| 2012/0319774 | A1 | 12/2012 | Ibrahim et al. |
| 2012/0326904 | A1 | 12/2012 | Jensen et al. |
| 2013/0070817 | A1 | 3/2013 | McCormack et al. |
| 2013/0195215 | A1 | 8/2013 | Manglani et al. |
| 2013/0196598 | A1 | 8/2013 | McCormack et al. |
| 2013/0257670 | A1 | 10/2013 | Sovero et al. |
| 2013/0316653 | A1 | 11/2013 | Kyles et al. |
| 2014/0016723 | A1 | 1/2014 | Mu et al. |
| 2014/0160939 | A1 | 6/2014 | Arad et al. |
| 2014/0273856 | A1 | 9/2014 | Kyles et al. |
| 2014/0273894 | A1 | 9/2014 | McCormack et al. |
| 2014/0281534 | A1 | 9/2014 | McCormack et al. |
| 2014/0286643 | A1 | 9/2014 | George et al. |
| 2014/0341232 | A1 | 11/2014 | McCormack et al. |
| 2015/0031320 | A1 | 1/2015 | Li et al. |
| 2015/0048959 | A1 | 2/2015 | Zhu |
| 2015/0065069 | A1 | 3/2015 | McCormack et al. |
| 2015/0094002 | A1 | 4/2015 | Kyles et al. |
| 2015/0131683 | A1 | 5/2015 | De Ruijter et al. |
| 2015/0381228 | A1 | 12/2015 | Milenkovic |
| 2016/0036495 | A1 | 2/2016 | McCormack et al. |
| 2016/0064827 | A1 | 3/2016 | Kyles et al. |
| 2016/0344484 | A1 | 11/2016 | Nakamura et al. |
| 2016/0380676 | A1 | 12/2016 | McCormack et al. |
| 2017/0046299 | A1 | 2/2017 | Isaac et al. |
| 2017/0086281 | A1 | 3/2017 | Avrahamy |
| 2017/0373709 | A1 | 12/2017 | Kondo et al. |
| 2018/0041235 | A1 | 2/2018 | Kyles et al. |
| 2018/0198428 | A1* | 7/2018 | Hanafi .................... H03F 3/245 |
| 2018/0309602 | A1 | 10/2018 | Zheng et al. |

* cited by examiner

ATTENUATOR HAVING EXTENDED ATTENUATION RANGE

BACKGROUND

The majority of today's state-of-the art wireless chips support several standards, and thus include multiple transceivers that operate in dual (or more) frequency bands. When such chips are implemented in a device having a single antenna, a front-end diplexer and transmit/receive (T/R) switches are used. Such circuits require stringent input impedance matching (small reflection coefficient, |S11|) at interfaces.

On the other hand, receiver circuitry within the wireless chip can experience a wide range of signal power levels from desired signals or unwanted signals, forcing the use of radio frequency (RF) attenuators to scale signal levels as desired. These on-chip attenuators can adversely affect impedance matching, and suffer from undesired tradeoffs between attenuation range, linearity, noise, and device reliability.

SUMMARY OF INVENTION

In one aspect, an apparatus includes: a first amplifier coupled to a first node of a receiver signal processing path, the first amplifier to receive and amplify a radio frequency (RF) signal; a first resistive attenuator coupled to the first node, the first resistive attenuator programmable to reduce a level of the RF signal; a second amplifier coupled in parallel with the first amplifier, the second amplifier to receive and amplify the RF signal; and a second attenuator coupled between the first node and the second amplifier, the second attenuator programmable to reduce the level of the RF signal.

In an implementation, the apparatus further includes a controller to control a first attenuation level of the first attenuator and to control a second attenuation level of the second attenuator. The controller may be configured to control the first attenuation level and the second attenuation level based at least in part on a gain level of the first amplifier and a gain level of the second amplifier. The controller may control the gain level of the first amplifier, the gain level of the second amplifier, the first attenuation level and the second attenuation level according to a predetermined order. In one implementation, the controller is to control the control the gain level of the first amplifier, the gain level of the second amplifier, the first attenuation level and the second attenuation level according to the predetermined order to maintain a return loss below a threshold level. The predetermined order may be first controlling the gain level of the first amplifier, second controlling the first attenuation level, third controlling the gain level of the second amplifier, and fourth controlling the second attenuation level.

In an implementation: the first resistive attenuator comprises a first programmable resistor coupled between the first node and a reference voltage node; and the second attenuator comprises: a first resistor coupled between the first node and an input of the second amplifier; and a second programmable resistor coupled between the input of the second amplifier and the reference voltage node.

In another implementation, the second attenuator comprises: a first capacitor coupled between the first node and an input of the second amplifier; and a first programmable capacitor coupled between the input of the second amplifier and a reference voltage node.

In an embodiment, the apparatus further includes: a third amplifier coupled in parallel with the first amplifier, the third amplifier to receive and amplify the RF signal; and a third attenuator coupled between the second attenuator and the third amplifier, the third attenuator to reduce the level of the RF signal. The second attenuator may be a programmable resistive attenuator and the third attenuator may be a programmable capacitive attenuator.

In an implementation, the apparatus further comprises: a third amplifier coupled in parallel with the first amplifier, the third amplifier to receive and amplify the RF signal; and a third attenuator coupled between the first node and the third amplifier, the third attenuator to reduce the level of the RF signal. The first resistive attenuator and the second attenuator can be located apart from the receiver signal processing path. The first resistive attenuator and the second attenuator may provide an attenuation range of at least 20 decibels and enable a reflection coefficient of the receiver to be less than approximately −10 decibels.

In another aspect, a method includes: determining, in a receiver, a signal level associated with a RF signal received in the receiver; based at least in part on the signal level associated with the RF signal, first controlling a gain of a first amplifier coupled along a receiver signal processing path of the receiver, the first amplifier to receive and amplify the RF signal, and thereafter controlling a gain of a first resistive attenuator coupled to an input of the first amplifier, until the first amplifier and the first resistive attenuator are turned off; and thereafter controlling a gain of a second attenuator coupled between the input of the first amplifier and an input of a second amplifier coupled in parallel with the first amplifier, and thereafter controlling a gain of the second amplifier.

In an implementation, the method further includes prior to controlling the gain of the first amplifier, controlling a gain of lower frequency gain control circuitry coupled along the receiver signal processing path downstream of the first amplifier. The method may also include iteratively controlling the gain of the first amplifier and controlling the gain of the first resistive attenuator, until the gain of the first amplifier is exhausted. The method may further include controlling the gain of the second attenuator and thereafter controlling the gain of the second amplifier, when the signal level associated with the RF signal exceeds a second level greater than the first level.

In yet another aspect, a wireless device includes: an antenna to receive and transmit RF signals of at least a first frequency band and a second frequency band; switching circuitry coupled to the antenna; matching network circuitry coupled to the switching circuitry to provide impedance matching; and a multi-band transceiver coupled to the matching network circuitry to process the RF signals of at least the first frequency band and the second frequency band.

The multi-band transceiver may include a first receiver having: a first amplifier adapted along a first receiver signal processing path between a first node and a second node, the first amplifier to receive and amplify a first RF signal of the first frequency band; a first resistive attenuator coupled between the first node and a reference voltage node, the first resistive attenuator programmable to reduce a level of the first RF signal of the first frequency band; a second amplifier coupled in parallel with the first amplifier between the first node and the second node, the second amplifier to receive and amplify the first RF signal of the first frequency band; and a first capacitive attenuator coupled in parallel with the first resistive attenuator between the first node and the reference voltage node, the first capacitive attenuator further coupled to an input of the second amplifier, the second capacitive attenuator programmable to reduce the level of the first RF signal of the first frequency band.

In an implementation, the wireless device further comprises a controller to control a first attenuation level of the first resistive attenuator and to control a second attenuation level of the first capacitive attenuator based at least in part on a signal level of the first RF signal of the first frequency band. The controller may be configured to first back off a gain of the first resistive attenuator and the first amplifier, and thereafter back off a gain of the first capacitive attenuator and the second amplifier, where the first amplifier has a greater gain than the second amplifier.

DETAILED DESCRIPTION

In various embodiments, controllable RF attenuators are provided that provide a wide attenuation range (e.g., at least 20 decibels (dB), and up to 30 dB), while maintaining a low impedance mismatch, implying small reflection coefficient across the wide attenuation range without sacrificing linearity, noise, and/or active device reliability.

More specifically, embodiments use resistive and (optionally) capacitive attenuators to provide this wide attenuation range while maintaining low impedance mismatch. To effect desired properties, at least programmable portions of the attenuators are located apart from a signal processing path of the receiver, reducing concerns as to linearity, noise and active device reliability, since there are no switches present in the signal processing path.

Figure 1:
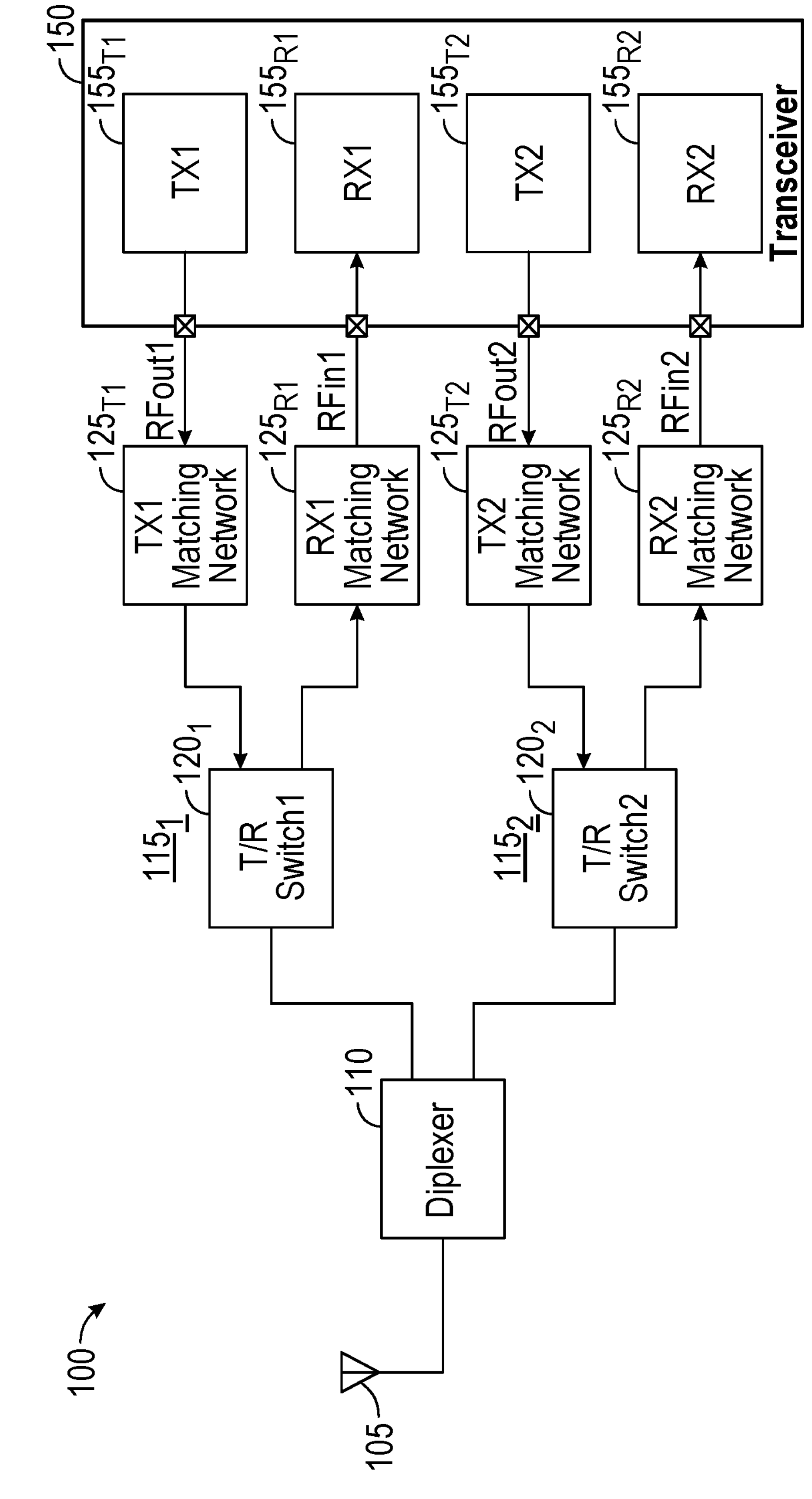
FIG. 1 is a block diagram of a device in accordance with an embodiment.

Referring now to FIG. 1, shown is a block diagram of a device in accordance with an embodiment. As shown in FIG. 1, device 100 may be any type of wireless device such as an Internet of Things (IoT) device, smartphone, tablet, laptop computer or any other device having wireless capability. Device 100 is shown at a high level to show an implementation in which multiple transceivers operate in different frequency bands. Thus common and separate circuitry are present, implicating the need for good impedance matching.

Specifically as shown in FIG. 1, device 100 is a dual-band wireless device capable of operation in different frequency bands, e.g., 2.4 Gigahertz (GHz) and/or 5 GHz bands. To this end, a single antenna 105 is configured to receive and transmit RF signals of the different bands. Antenna 105 couples to a diplexer 110. Diplexer 110 is configured to provide frequency separation and isolation, and selectively route incoming RF signals of the different bands to appropriate circuitry. Specifically as shown, incoming RF signals of a first frequency band are provided to a first switch $\mathbf{120}_1$, while incoming RF signals of a second frequency band are provided to a second switch $\mathbf{120}_2$. Switches 120 are configured to perform transmit and receive switching for a given signal processing path.

In a transmit direction, diplexer 110 receives outgoing RF signals of the different bands and provides them to antenna 105. While two similarly configured signal paths are present (and additional such paths may be present in other cases), components of a first signal path $\mathbf{115}_1$ are discussed for ease of discussion. Understand that similar components are present in a second signal path $\mathbf{115}_2$.

With respect to first signal path $\mathbf{115}_1$, switch 120 couples, respectively in transmit and receive directions to corresponding matching networks $\mathbf{125}_{T1,R1}$ having matching circuitry for impedance matching between switch 120 and corresponding pins of a transceiver 150. As shown in the embodiment of FIG. 1, transceiver 150 is implemented as a multi-band transceiver including transmitter and receiver circuitry for each of multiple bands. Note in an embodiment, transceiver 150 may be implemented on a single semiconductor die of an integrated circuit (IC), where each pin is an external interconnection of the IC. In such cases, understand that each such pin may couple via bond wires or other conductive elements to corresponding on-die pads (not shown for ease of illustration in FIG. 1).

In the high level shown in FIG. 1, transceiver 150 is formed of a pair of transmitters $\mathbf{155}_{T1,\ T2}$ and a pair of receivers $\mathbf{155}_{R1,\ R2}$. Understand that transceiver 150 may further include control circuitry to configure the transmitters and receivers for appropriate operation in a selected band as well as to provide a control interface with additional circuitry of device 100.

Understand that additional matching network circuitry may be present within each of the transmitters and receivers of transceiver 150, details of which are discussed further herein. With an implementation as in FIG. 1 having multi-band operation, low impedance mismatch (implying small reflection coefficient, |S11|) is required across all of diplexer 110, switches 120 matching networks 125 and chip input/output interfaces to enable desired figures of merit to be achieved. To this end, the matching circuitry within transceiver 150 may provide this good impedance matching (that is low impedance mismatch) across the varying frequency bands of operation, as will be described herein. Although illustrated at this high level in the embodiment of FIG. 1, understand that many variations and alternatives are possible. That is, the impedance matching techniques described herein may be implemented in other device configurations, particularly where multi-band operation is desired.

Figure 2:
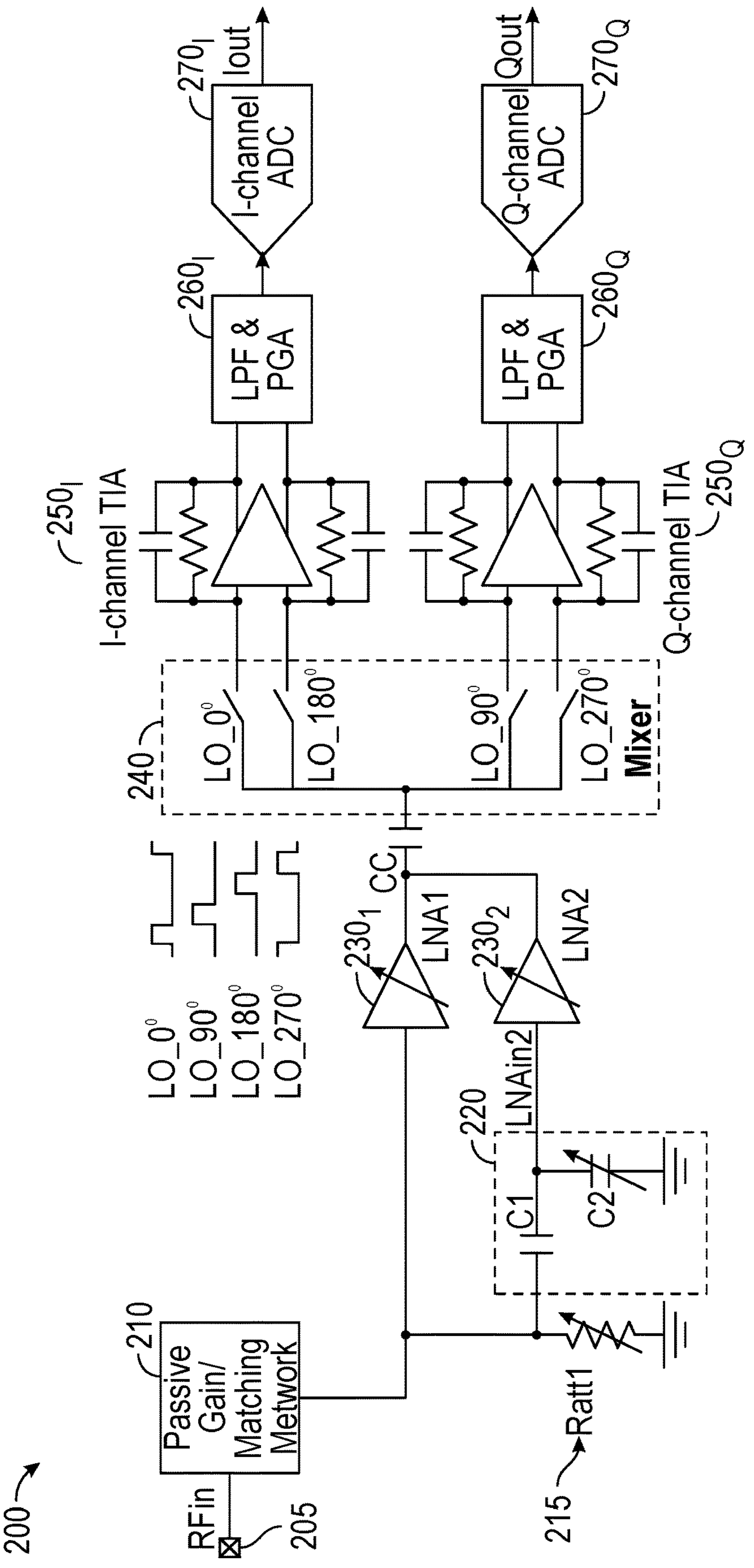
FIG. 2 is a block diagram of a receiver in accordance with an embodiment.

Referring now to FIG. 2, shown is a block diagram of a receiver in accordance with an embodiment. As shown in FIG. 2, receiver 200 may be a given one of multiple receivers present within a multi-band transceiver, and as such may be implemented with on-chip circuitry. As shown, incoming RF signals (RFin) are provided via an input pin 205 to a matching network 210 that further includes passive gain components. In an embodiment, matching network 210 may be implemented with one or more inductors and capacitors.

The RF signals are then provided to attenuator circuitry formed of a programmable resistive attenuator (Ratt1) 215 and a programmable capacitive attenuator 220 to enable impedance matching across a wide frequency range. The attenuator circuitry is configured to lower the input RF signal level that is provided to further portions of the signal processing path when large signal levels are present. In this way, downstream linearity requirements are relaxed so that the signal processing path can reliably operate with large desired and/or blocker powers. In addition, the attenuator circuitry controls signal levels to reduce or avoid signal chain saturation (or clipping), up to very large signal levels.

As shown in FIG. 2, resistive attenuator Ratt1 is implemented via a programmable resistor, and attenuator 220 is implemented via a capacitive attenuator having a fixed capacitor C1 and a programmable capacitor C2.

The resistive attenuator and attenuator 220 operate to attenuate incoming RF signals as may be needed based on a power level of the RF signals. The resulting RF signals are provided to corresponding low noise amplifiers (LNA) $\mathbf{230}_{1}$ $_{2}$. In various embodiments, LNA $\mathbf{230}_{1}$ may be a controllable main path amplifier. In one implementation LNA programmability could be implemented with multiple equal weight slices combined with finer binary weighted slices. For example, LNA $\mathbf{230}_{1}$ can be implemented with equal weight slices (e.g., each of 4× strength) and LNA $\mathbf{230}_{2}$ can be implemented with binary weighted slices (e.g., one 2× and one 1× strength). Depending upon implementation, LNAs 230 can be current mode low noise transconductance amplifiers (LNTAs) or voltage mode LNAs. As used herein, the terms "low noise amplifier" and "LNA" encompass both a current mode LNTA and a voltage mode LNA, unless specifically stated otherwise.

The resulting amplified signals from LNA 230 couple through a coupling capacitor CC to a mixer 240. As shown in the embodiment of FIG. 2, mixer 240 is implemented as a quadrature mixer to downconvert the incoming RF signal to a lower frequency signal, e.g., an intermediate (IF) frequency or baseband (zero-IF) complex signal that is provided to corresponding quadrature signal paths, namely an in-phase (I) path and a quadrature-phase (Q) path.

Each path includes a transimpedance amplifier (TIA) 250*i*, Q, which transforms current signals to voltage signals. In turn, the IF signals of the complex paths are provided to corresponding filters and amplifiers, more specifically low pass filters (LPFs) and programmable gain amplifiers (PGAs) $\mathbf{260}_{I,\ Q}$. The resulting filtered and amplified IF signals in turn are provided to digitizers, implemented as analog-to-digital converters (ADCs) $\mathbf{270}_{I,\ Q}$. Although shown at this high level in the embodiment of FIG. 2, many variations and alternatives are possible. For example, while the embodiment of FIG. 2 illustrates details of a capacitive attenuator on the secondary branch, in other implementations a resistive attenuator or a combined resistive-capacitive attenuator may be present.

Figure 3A:
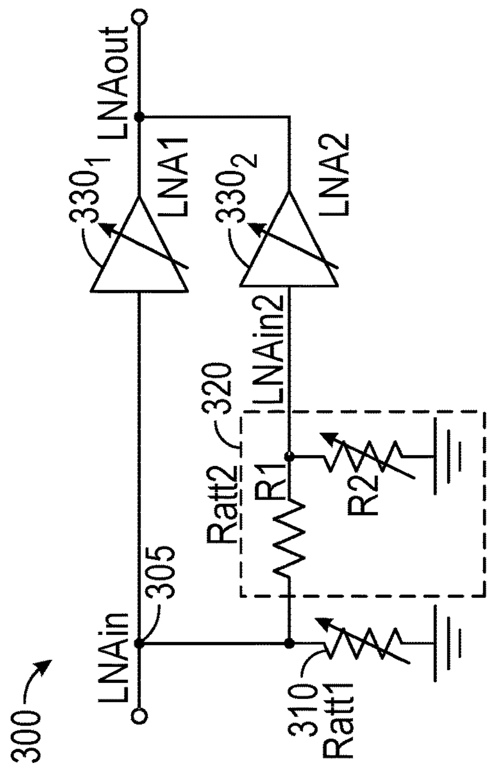
FIG. 3A is schematic diagram of a resistive attenuator in accordance with an embodiment.

Referring now to FIG. 3A, shown is a schematic diagram of a resistive attenuator in accordance with an embodiment. As shown in FIG. 3A, circuit 300 is a portion of a receiver including an LNA, implemented as a primary LNA $\mathbf{330}_{1}$ and a secondary LNA $\mathbf{330}_{2}$. Although shown with two branches in this illustration, understand that in other embodiments additional branches may be present. Furthermore, FIG. 3A shows a high level with a single programmable amplifier on each branch. Understand however that each of these LNAs 330 may be implemented with multiple slices that can be programmably enabled or disabled.

Still referring to FIG. 3A, a first resistive attenuator 310 couples between a primary signal path coupled to the input of LNA $\mathbf{330}_{1}$ and a reference voltage node (e.g., a ground node). The value of programmable resistor 310 may be controlled depending upon a desired attenuation level. Depending on implementation, the programmability of resistor 310 can be controlled by thermometer, binary, radix, or other weighting scheme (or combinations thereof). For example in one implementation, programmable resistor 310 can be implemented with a first plurality of thermometer-weighted resistors and a second plurality of binary-weighted resistors. Understand that each resistor can be controlled with a controllable switch, which may be implemented as a ground-referred metal oxide semiconductor field effect transistor (MOSFET).

The gain of the primary path including LNA $\mathbf{330}_{1}$ is given by:

$$\text{Gain} = \frac{R_{att1}}{R_{att1} + R_s'} G_{LNA1} \tag{Eq. 1}$$

In turn, the reflection coefficient in dB, $S_{11,dB}$ is given by:

$$S_{11,dB} = 20\log\left|\frac{R_{att1} - R_s'}{R_{att1} + R_s'}\right| \tag{Eq. 2}$$

Where $R'_s$ is the source impedance referred to the LNA input.

As further illustrated, a second resistive attenuator 320 couples between primary signal path node 305 and secondary LNA $\mathbf{330}_{2}$. As illustrated, resistive attenuator 320 includes a fixed resistor R1 coupled in series to the input of LNA $\mathbf{330}_{2}$ and a programmable resistor R2 coupled between the input to LNA $\mathbf{330}_{2}$ and the reference voltage node. The value of programmable resistor R2 may be controlled depending upon the desired attenuation level. Programmable resistor R2 may be implemented similarly to programmable resistor 310 discussed above.

This arrangement with a secondary branch having resistive attenuator 320 and secondary LNA 330 maintains improved matching across a wider gain range. More specifically, this configuration provides a L-network attenuator with R1 that enables a low reflection coefficient (S11) across the wider R2 adjustment range. In practice, secondary LNA $\mathbf{330}_{2}$ may be a lower strength amplifier as compared to primary LNA $\mathbf{330}_{1}$. In this implementation of FIG. 3A, this secondary branch may have a gain given by:

$$\text{Gain} = \frac{R_3}{R_2 + R_3 + R_s'\left(1 + \frac{R_2 + R_3}{R_{att1}}\right)} G_{LNA2} \tag{Eq. 3}$$

In turn, the reflection coefficient is given by:

$$S_{11,dB} = 20\log\left|\frac{R_s' - (R_2+R_3)/\left(1+\frac{R_2+R_3}{R_{att1}}\right)}{R_s' - (R_2+R_3)/\left(1+\frac{R_2+R_3}{R_{att1}}\right)}\right| \quad \text{Eq. 4}$$

Figure 3B:
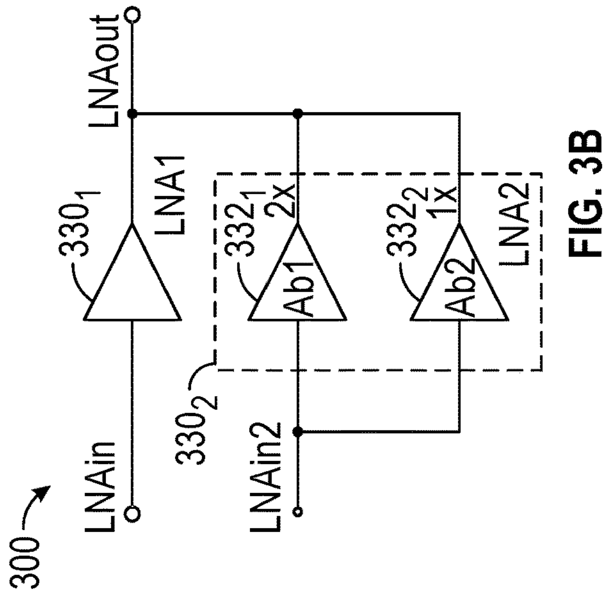
FIG. 3B is a schematic diagram of a secondary low noise amplifier in accordance with an embodiment.

FIG. 3B illustrates further details of secondary LNA 330$_2$. As shown, LNA 330$_2$ may be implemented with parallel slices. In the embodiment shown, these parallel slices may be implemented as binary-weighted amplifiers, namely a 2× amplifier slice 332$_1$ and a 1× amplifier slice 332$_2$. Of course, additional binary weighted slices may be present in other embodiments. And other encoding schemes such as thermometer-weighted slices may be present.

Figure 3C:
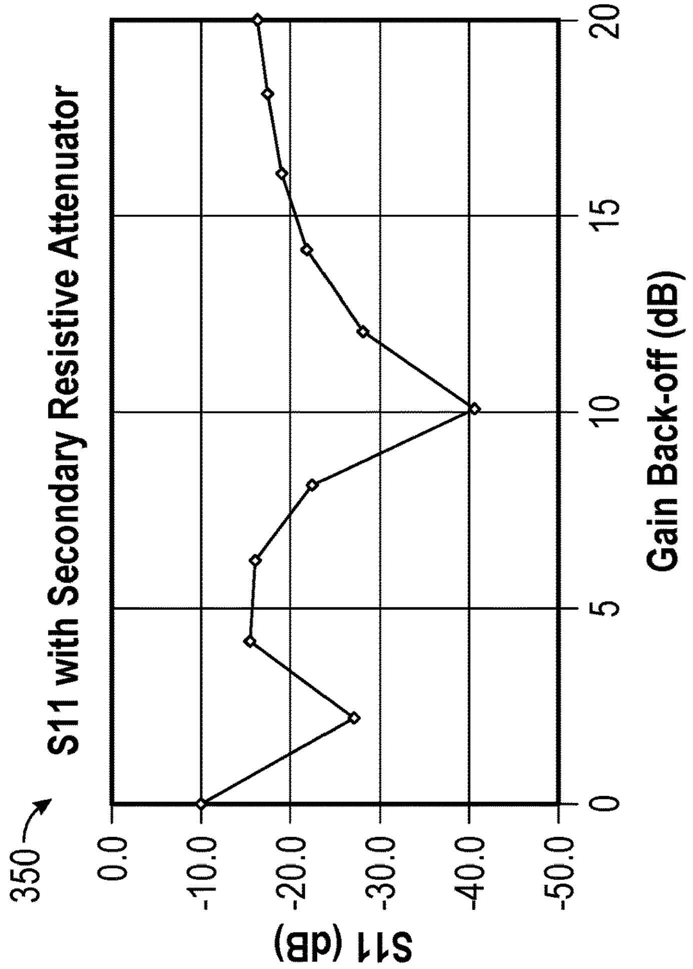
FIG. 3C is a graphical illustration of reflection coefficient with varying secondary resistive attenuator levels in accordance with an embodiment.

Referring now to FIG. 3C, shown is a graphical illustration of reflection coefficient (in dB) S11 with varying primary and secondary resistive attenuator levels. Initially, Ratt1 is engaged while meeting S11<−10 dB requirement. At this point, further reduction of Ratt1 would violate S11 requirements. For additional attenuation the Ratt1 and LNA 330$_1$ are also turned off and Ratt2 along with LNA 330$_2$ branch is engaged. However, in general it is also possible to freeze Ratt1 without turning it off and continue gain reduction with Ratt2. Note that, whenever Ratt2 is engaged, LNA 330$_1$ is disabled. In this case, minimum impedance mismatch occurs with a gain back off of approximately 10 dB. Although embodiments are not limited in this regard, this gain back off may occur with values of the resistive attenuator arrangement in FIG. 3A of approximately 20 dB range.

In one embodiment, the curve in FIG. 3C can be implemented in operation by control of the programmable attenuator in which initially first resistive attenuator 310 and LNA 330$_1$ gain slices are backed off while S11 requirements are still met. Thereafter the components of the secondary branch (with secondary resistive attenuator 320 and LNA 330$_2$) are backed off (with the components of the primary branch being turned off in which it is bypassed). Thus in this example, primary LNA 330$_1$ is bypassed (turned off, along with Ratt1) when Ratt2 and secondary LNA 330$_2$ are engaged. However, in other embodiments an attenuation arrangement is possible in which when LNA 330$_1$ is off, Ratt1 can be kept on (to provide some attenuation).

Figure 4A:
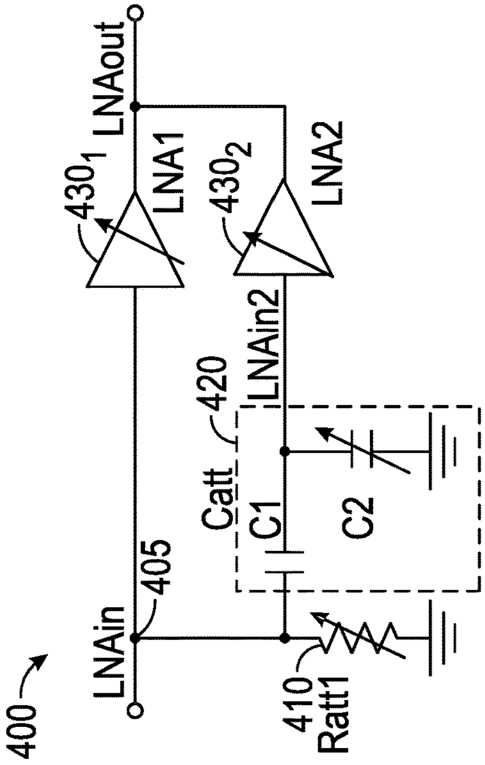
FIG. 4A is a schematic diagram of a capacitive attenuator in accordance with an embodiment.

Referring now to FIG. 4A, shown is a schematic diagram of a capacitive attenuator in accordance with an embodiment. As shown in FIG. 4A, circuit 400 is a portion of a receiver including an LNA, implemented as a primary LNA 430$_1$ and a secondary LNA 430$_2$ (of course, in other embodiments additional branches may be present). As with FIG. 3A above, each LNA 430 may be implemented with multiple slices that can be programmably enabled or disabled.

Still referring to FIG. 4A, a resistive attenuator 410 couples between a primary signal path and a reference voltage node. The value of programmable resistor 410 may be controlled depending upon a desired attenuation level.

As further illustrated, a capacitive attenuator 420 couples between primary signal path node 405 and secondary LNA 430$_2$. Capacitive attenuator 420 includes a fixed capacitor C1 coupled in series to the input of LNA 430$_2$ and a programmable capacitor C2 coupled between the input to LNA 430$_2$ and the reference voltage node. The value of programmable capacitor C2 may be controlled depending upon the desired attenuation level. Depending on implementation, the programmability of capacitor C2 can be controlled by thermometer, binary, radix, or other weighting scheme (or combinations thereof). Understand that each capacitor can be controlled with a controllable switching circuitry. To ensure that unconnected capacitors are not left floating, this switching circuitry can be implemented with a pair of complementary MOSFETs (having commonly coupled gate terminals). In this way, when unconnected, a capacitor is coupled to a well-defined voltage with a high-resistance switch (e.g., implemented with a PMOS device and a resistor). In turn, a capacitor is switched in with a low-resistive switch (e.g., implemented with an NMOS device).

In this implementation of FIG. 4A, the secondary branch may have a gain given by:

$$\text{Gain} = \frac{R_{att1}}{R_{att1}+R_s'}\frac{C_1}{C_1+C_2}G_{LAN2} \quad \text{Eq. 5}$$

In turn, the reflection coefficient in dB, $S_{11}$, is given by:

$$S_{11,dB} = 20\log\left|\frac{R_{att1}-R_s'}{R_{att1}+R_s'}\right| \quad \text{Eq. 6}$$

With this configuration, the secondary branch having capacitive attenuator 420 and LNA 430$_2$ maintains improved matching across a wider gain range. More specifically, the L-network attenuator with C1 and C2 provides improved S11 across a wide gain range. In embodiments, LNA 430$_2$ is a lower-strength LNA compared to LNA 430$_1$. Consequently, input capacitance of LNA 430$_2$ is small, enabling use of small C1 and C2 values for the capacitive attenuator.

In one implementation, initially resistive attenuator 410 and LNA 430$_1$ gain slices are backed off in a range where return loss is kept below a specified limit. Then, the attenuation level of resistive attenuator 410 is frozen, the gain of the secondary branch is backed off (with LNA 430$_1$ being off). As compared to the implementation of FIG. 3A, this implementation may have a better gain back off noise tradeoff (as there is no noise figure degradation from the capacitive attenuator), and it may have less linearity degradation impact.

Figure 4B:
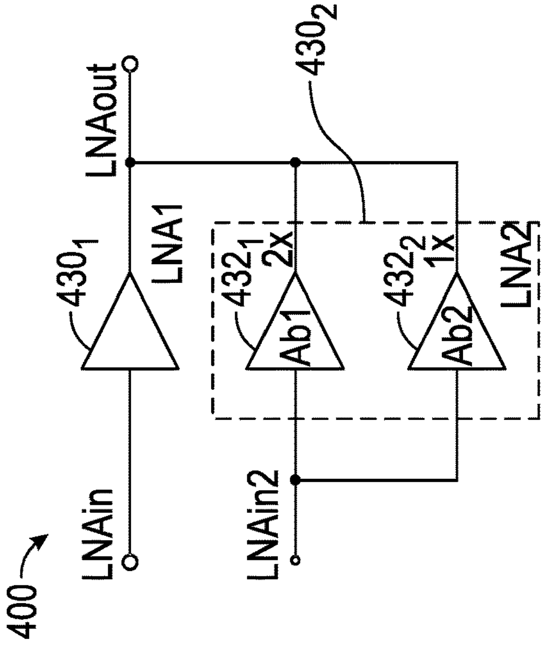
FIG. 4B is a schematic diagram of a secondary low noise amplifier in accordance with embodiment.

FIG. 4B illustrates further details of secondary LNA 430$_2$. As shown, LNA 430$_2$ may be implemented with parallel slices, namely binary-weighted amplifier slices 432$_{1,2}$. In other implementations, additional binary or other weighted slices may be present.

Figure 4C:
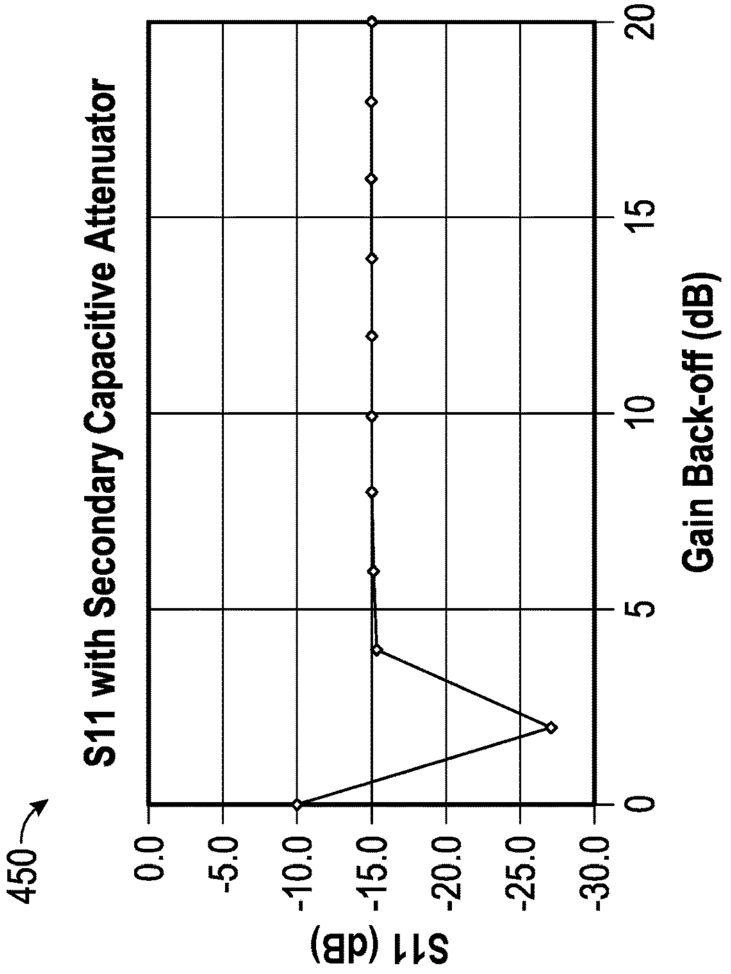
FIG. 4C is a graphical illustration of reflection coefficient with varying secondary capacitive attenuator levels in accordance with an embodiment.

Referring now to FIG. 4C, shown is a graphical illustration, showing reflection coefficient S11 with varying primary resistive attenuator and secondary capacitive attenuator levels. The first 4 dB of attenuation is done with resistive attenuator 410 and remaining attenuation is done with the capacitive attenuator (while keeping the attenuation of attenuator 410 at 4 db level). As shown, minimal reflective loss occurs with a gain back off of approximately 2 dB. Although embodiments are not limited in this regard, this gain back off may occur with values of the capacitive attenuator arrangement in FIG. 4A of approximately 12 to 18 dB.

In other embodiments, there can be additional branches in a receiver signal processing path, with controllable resistive and capacitive attenuators coupled to the different paths.

Figure 5A:
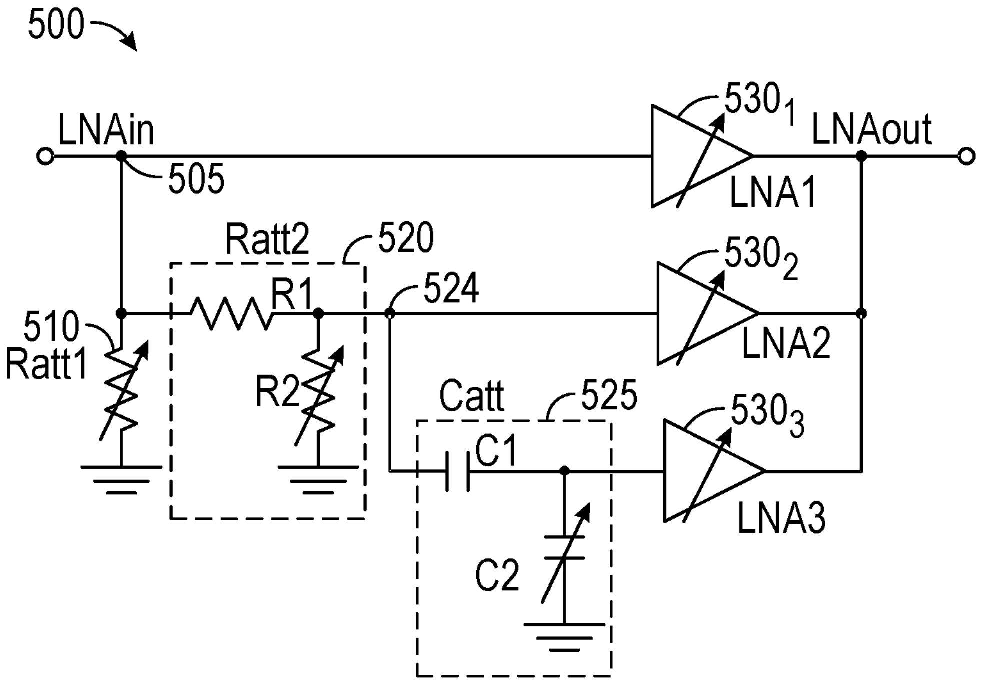
FIG. 5A is a schematic diagram of a combined resistive and capacitive attenuator in accordance with an embodiment.

Referring now to FIG. 5A, shown is a schematic diagram of a combined resistive and capacitive attenuator in accordance with an embodiment. As shown in FIG. 5A, circuit 500 is a portion of a receiver including an LNA, implemented as a primary LNA $530_1$, a secondary LNA $530_2$, and a tertiary LNA $530_3$ (of course, in other embodiments additional branches may be present). As with the above discussion, each LNA 530 may be implemented with multiple slices that can be programmably enabled or disabled.

Still referring to FIG. 5A, a first resistive attenuator 510 couples between a primary signal path and a reference voltage node. The value of first resistive attenuator 510 may be controlled depending upon a desired attenuation level.

As further illustrated, a second resistive attenuator 520 couples between a primary signal path node 505 and secondary LNA $530_2$. Resistive attenuator 520 includes a fixed resistor R1 coupled in series to the input of LNA $530_2$ and a programmable resistor R2 coupled between the input to LNA $530_2$ and the reference voltage node. The value of programmable resistor R2 may be controlled depending upon the desired attenuation level.

Still with reference to FIG. 5A, a capacitive attenuator 525 couples between a secondary signal path node 524 and tertiary LNA $530_3$. As illustrated, capacitive attenuator 525 includes a fixed capacitor C1 coupled in series to the input of LNA $530_3$ and a programmable capacitor C2 coupled between the input to LNA $530_3$ and the reference voltage node. The value of programmable capacitor C2 may be controlled depending upon the desired attenuation level.

In this implementation of FIG. 5A, the tertiary branch may have a gain given by:

$$\text{Gain} = \frac{R_3}{R_2 + R_3 + R_s'\left(1 + \frac{R_2 + R_3}{R_{att1}}\right)} \frac{C_1}{C_1 + C_2} G_{LNA3} \quad \text{Eq. 7}$$

In turn, the reflection coefficient is given by:

$$S_{11,dB} = 20\log\left|\frac{R_s' - (R_2 + R_3)/\left(1 + \frac{R_2 + R_3}{R_{att1}}\right)}{R_s' + (R_2 + R_3)/\left(1 + \frac{R_2 + R_3}{R_{att1}}\right)}\right| \quad \text{Eq. 8}$$

The secondary and tertiary branches maintain improved matching across a wider gain range. Note that LNAs $530_{2,3}$ may be of lower strength than LNA $530_1$. In operation, resistive attenuator 510 and LNA $530_1$ gain slices are exhausted during gain back off. Then, the secondary branch with resistive attenuator 520 and LNA $530_2$ are backed off until S11 reaches a desired low level (with the components of the primary branch off). Lastly, capacitive attenuator 525 and LNA $530_3$ are engaged while turning off LNA $530_2$ and keeping resistive attenuators 510 and 520 at their desired S11 settings.

Figure 5B:
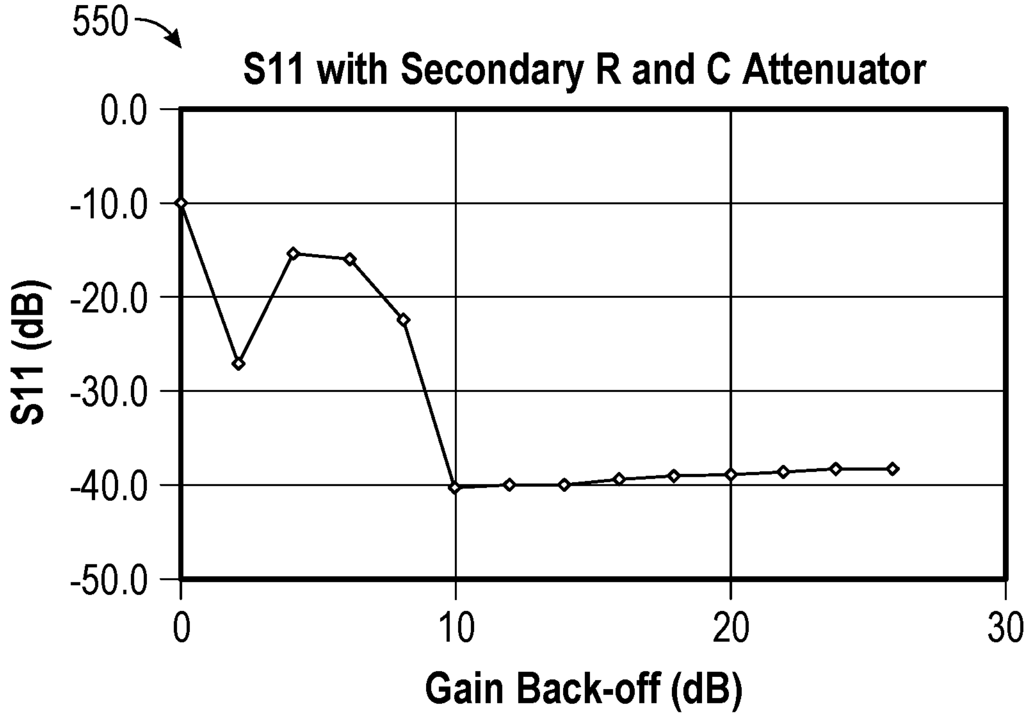
FIG. 5B is a graphical illustration of reflection coefficient with varying secondary resistive and capacitive attenuator levels in accordance with an embodiment.

Referring now to FIG. 5B, shown is a graphical illustration of reflection coefficient S11 with varying primary and secondary resistive and capacitive attenuator levels.

Figure 6:
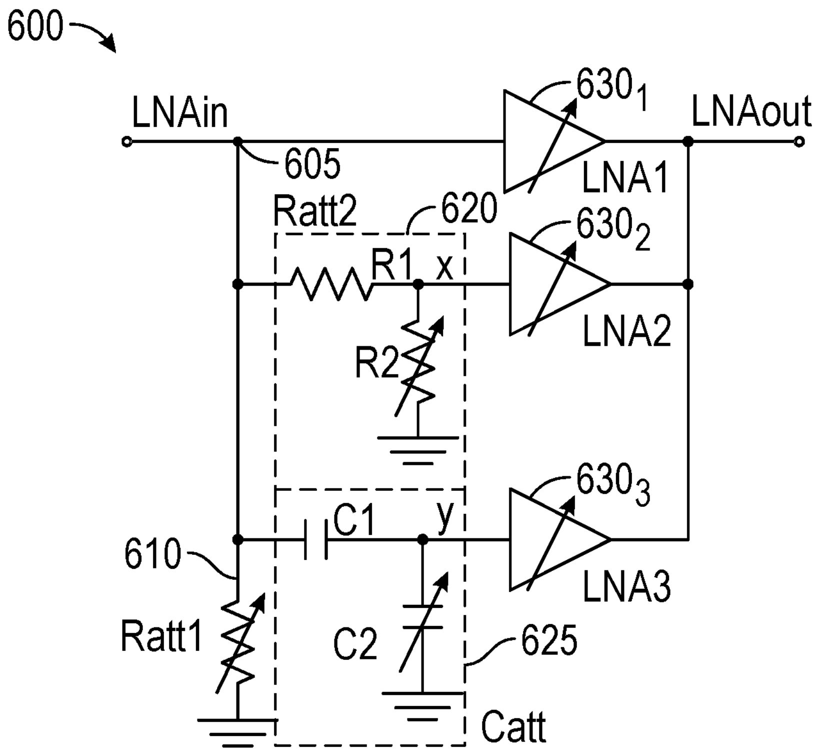
FIG. 6 is a schematic diagram illustrating another implementation of a controllable attenuator in accordance with an embodiment.

Yet other implementations of a controllable attenuator are possible. Referring now to FIG. 6, shown is a schematic diagram illustrating another implementation of a controllable attenuator in accordance with an embodiment. As shown in FIG. 6, a combined resistive and capacitive attenuator includes parallel controllable resistive and capacitive paths. With this arrangement, there can be independent control while optimizing for noise and linearity, such that both branches can be adjusted concurrently.

Specifically, as shown in FIG. 6, a first resistive attenuator 610 couples between a primary signal path node 605 and a reference voltage node. In turn, a second resistive attenuator 620 couples between primary signal path node 605 and a secondary LNA $630_2$. Resistive attenuator 620 may be implemented the same as resistive attenuator 320 of FIG. 3A. Similarly, a capacitive attenuator 625 couples between primary signal path node 605 and a tertiary LNA $630_3$. Capacitive attenuator 625 may be implemented the same as capacitive attenuator 420 of FIG. 4A. Although shown at this high level in the embodiment of FIG. 6, many variations and alternatives are possible.

Figure 7:
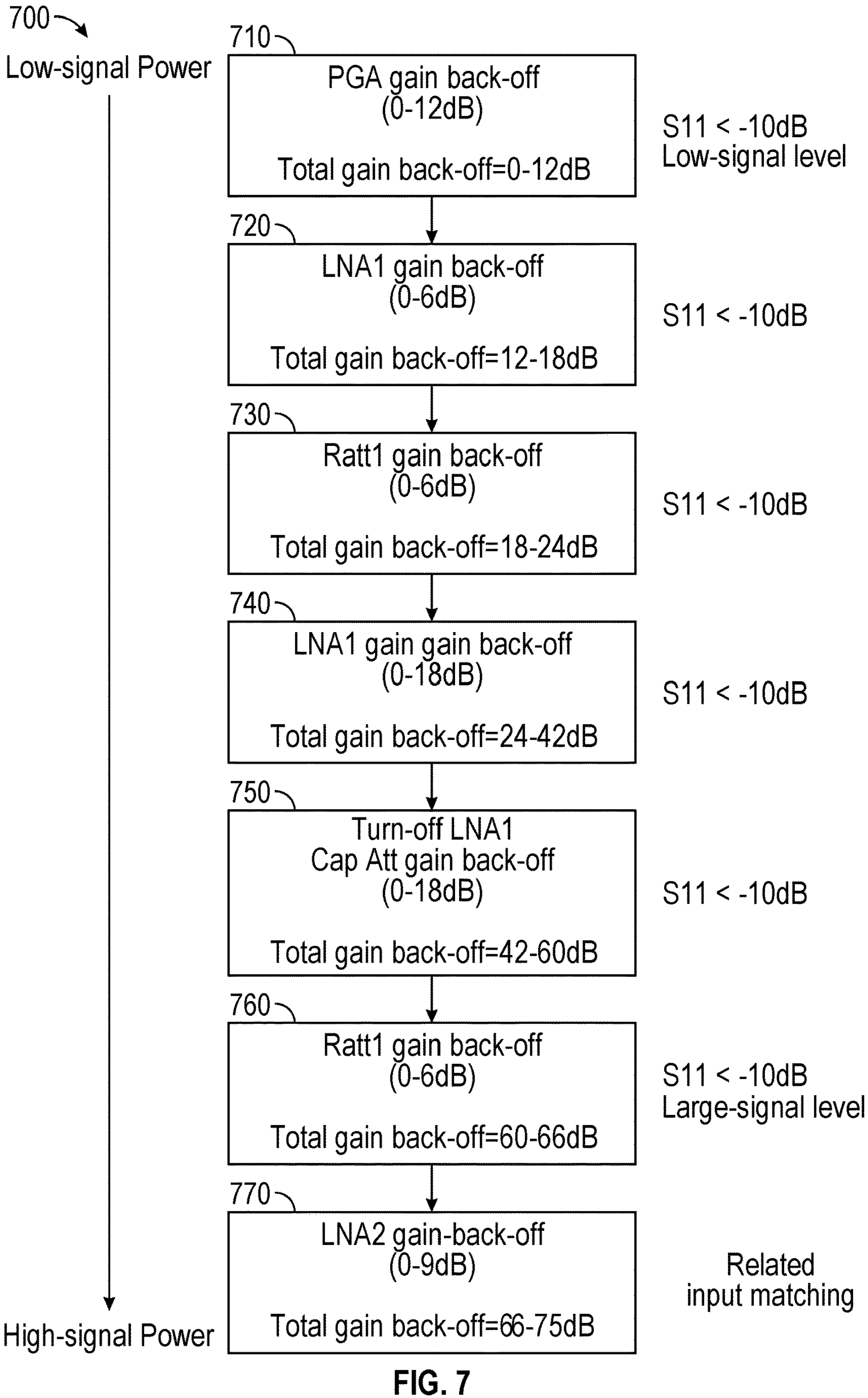
FIG. 7 is a flow diagram of a method in accordance with an embodiment.

Referring now to FIG. 7, shown is a flow diagram of a method in accordance with an embodiment. As shown in FIG. 7, method 700 is a method for controlling various gain and attenuator elements to enable good receipt of incoming RF signals, while providing an attenuator configuration having improved impedance matching over a wide range of frequencies of operation.

Method 700 may be performed at least in part by a hardware circuit, such as a controller that executes instructions stored in a non-transitory storage medium. As an example, a receiver may include a controller that is configured to receive incoming power level information such as may be obtained from peak detectors located at one or more points within a receiver signal processing path (e.g., at RF, IF and possibly digital locations) and based at least in part on such signal level information, determine appropriate gain settings for gain components such as different LNA branches, as well as appropriate programmable settings for controllable resistive and/or capacitive attenuators as described herein.

Understand that FIG. 7 shows various gain and attenuator control operations that may be performed based on signal power level. When signal levels are relatively low, more gain components with higher gain settings are coupled into a receiver signal processing path. As signal levels increase, one or more of these gain components can have their gain settings updated, e.g., by backing off the gain levels and/or be turned off. Note also that while FIG. 7 illustrates specific gain back off levels and return loss measures, these values are illustrated for example purposes only.

As shown, at low signal power levels, a PGA gain may be backed off (block 710). This PGA may be a gain component present in IF filter circuitry and/or within a controllable IF amplifier, such as a TIA or PGA. At this low level signal level, the reflection coefficient may be typically lower than −10 dB.

As shown in blocks 720, 730 and 740, as signal power levels increase, first a primary LNA branch may have its gain backed off, then a resistive attenuator may have its gain backed off, and then additional gain may be backed off within the primary LNA branch. Note that at all of these signal levels, the reflection coefficient may be typically lower than −10 dB.

At block 750 as signal power level increases further, the primary LNA branch may be turned off (while a resistive attenuator can be left on (e.g., at its last back off level (e.g., 6 dB in this implementation)) and a gain back off process may be performed with respect to a capacitive attenuator. With increasing signal power levels, at block 760 the resistive attenuator may again have its gain backed off. At block 760, 0-6 dB Ratt1 gain back-off is in addition to the earlier 6 dB back-off (at block 730).

Finally, at block 770 at relatively high signal power levels, a secondary and/or tertiary gain branch may have its gain backed off. Note that at such high signal power levels there may be relaxed input matching. Of course, other values, and other orders of attenuator/gain control may occur in other embodiments.

Figure 8:
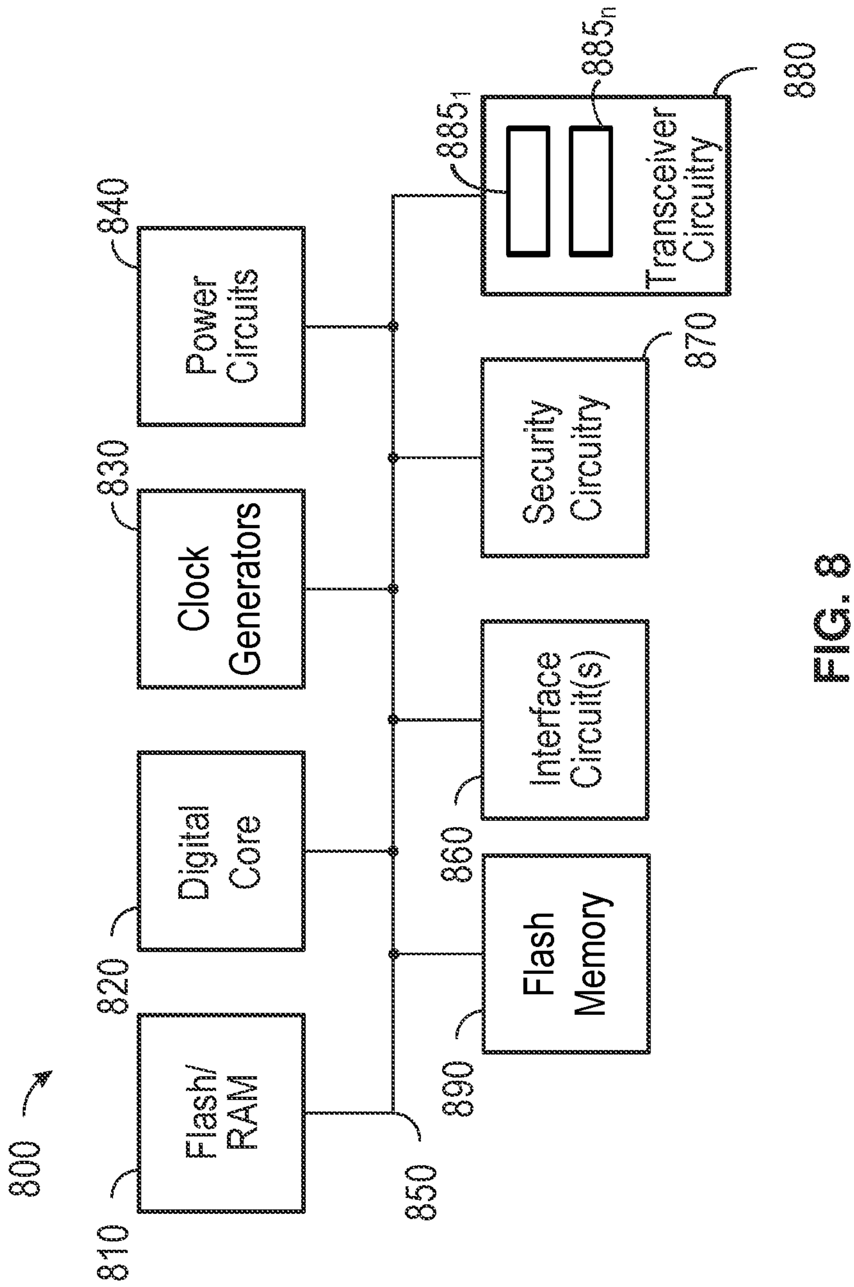
FIG. 8 is a block diagram of a representative integrated circuit that incorporates an embodiment.

Referring now to FIG. 8, shown is a block diagram of a representative integrated circuit 800 that includes dynamically controllable RF attenuators as described herein. In the embodiment shown in FIG. 8, integrated circuit 800 may be, e.g., a dual mode wireless transceiver that may operate according to one or more wireless protocols (e.g., WLAN and Bluetooth, among others) or other device that can be used in a variety of use cases. In one or more embodiments, the circuitry of integrated circuit 800 shown in FIG. 8 may be implemented on a single semiconductor die.

Integrated circuit 800 may be included in a range of devices including a variety of stations, including smartphones, wearables, smart home devices, other consumer devices, or industrial, scientific, and medical (ISM) devices, among others.

In the embodiment shown, integrated circuit 800 includes a memory system 810 which in an embodiment may include volatile storage, such as RAM and non-volatile memory as a flash memory. As further shown integrated circuit 800 also may include a separate flash memory 890 (or other non-volatile memory), optionally. Flash memory 890 may be implemented as a non-transitory storage medium that can store instructions and data. Such non-volatile memory may store instructions, including instructions for identifying conditions that may trigger a change in RF attenuation levels, as described herein.

Memory system 810 couples via a bus 850 to a digital core 820, which may include one or more cores and/or microcontrollers that act as a main processing unit of the integrated circuit. In turn, digital core 820 may couple to clock generators 830 which may provide one or more phase locked loops or other clock generator circuitry to generate various clocks for use by circuitry of the IC.

As further illustrated, IC 800 further includes power circuitry 840, which may include one or more voltage regulators. Additional circuitry may optionally be present depending on particular implementation to provide various functionality and interaction with external devices. Such circuitry may include interface circuitry 860 which may provide a LAN or other interface with various off-chip devices, and security circuitry 870 which may perform wireless security techniques.

In addition, as shown in FIG. 8, transceiver circuitry 880 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 880 includes separate branches of RF attenuators 885$_{1\text{-}n}$ that can be dynamically selected, based at least in part on signal levels to provide a desired amount of attenuation while maintaining a small reflection coefficient, as described herein. Understand while shown with this high level view, many variations and alternatives are possible.

Figure 9:
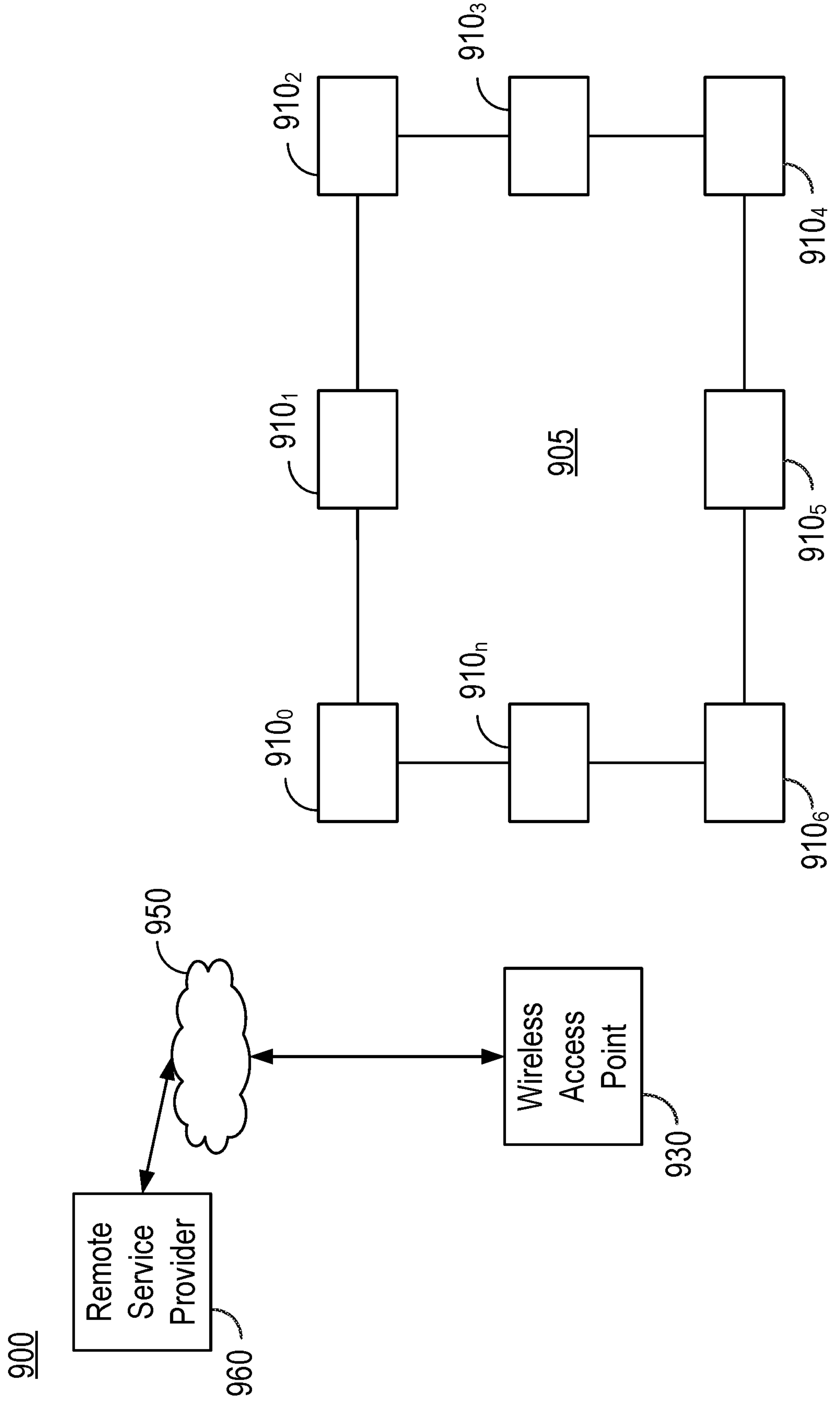
FIG. 9 is a high level diagram of a network in accordance with an embodiment.

ICs such as described herein may be implemented in a variety of different devices such as wireless stations, IoT devices or so forth. Referring now to FIG. 9, shown is a high level diagram of a network in accordance with an embodiment. As shown in FIG. 9, a network 900 includes a variety of devices, including wireless stations including smart devices such as IoT devices, access points and remote service providers, which may leverage embodiments for dynamic RF attenuator control as described herein.

In the embodiment of FIG. 9, a wireless network 905 is present, e.g., in a building having multiple wireless devices 910$_{0\text{-}n}$. As shown, wireless devices 910 couple to an access point 930 that in turn communicates with a remote service provider 960 via a wide area network 950, e.g., the internet. Understand while shown at this high level in the embodiment of FIG. 9, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:

a first amplifier directly coupled to a first node of a receiver signal processing path, the first amplifier to receive and amplify a radio frequency (RF) signal;

a first resistive attenuator directly coupled to the first node, the first resistive attenuator programmable to reduce a level of the RF signal;

a second amplifier coupled in parallel with the first amplifier, the second amplifier to receive and amplify the RF signal; and a second attenuator coupled between the first node and the second amplifier, the second attenuator programmable to reduce the level of the RF signal.

2. The apparatus of claim 1, further comprising a controller to control a first attenuation level of the first resistive attenuator and to control a second attenuation level of the second attenuator.

3. The apparatus of claim 2, wherein the controller is to control the first attenuation level and the second attenuation level based at least in part on a gain level of the first amplifier and a gain level of the second amplifier.

4. The apparatus of claim 3, wherein the controller is to control the gain level of the first amplifier, the gain level of the second amplifier, the first attenuation level and the second attenuation level according to a predetermined order.

5. The apparatus of claim 4, wherein the controller is to control the control the gain level of the first amplifier, the gain level of the second amplifier, the first attenuation level and the second attenuation level according to the predetermined order to maintain a return loss below a threshold level.

6. The apparatus of claim 4, wherein the predetermined order comprises first controlling the gain level of the first amplifier, second controlling the first attenuation level, third controlling the gain level of the second amplifier, and fourth controlling the second attenuation level.

7. The apparatus of claim 1, wherein:

the first resistive attenuator comprises:

a first programmable resistor coupled between the first node and a reference voltage node; and the second attenuator comprises:

a first resistor coupled between the first node and an input of the second amplifier; and a second programmable resistor coupled between the input of the second amplifier and the reference voltage node.

8. The apparatus of claim 1, wherein the second attenuator comprises:

a first capacitor coupled between the first node and an input of the second amplifier; and a first programmable capacitor coupled between the input of the second amplifier and a reference voltage node.

9. The apparatus of claim 1, further comprising:

a third amplifier coupled in parallel with the first amplifier, the third amplifier to receive and amplify the RF signal; and a third attenuator coupled between the second attenuator and the third amplifier, the third attenuator to reduce the level of the RF signal.

10. The apparatus of claim 9, wherein the second attenuator comprises a programmable resistive attenuator and the third attenuator comprises a programmable capacitive attenuator.

11. The apparatus of claim 1, further comprising:

a third amplifier coupled in parallel with the first amplifier, the third amplifier to receive and amplify the RF signal; and a third attenuator coupled between the first node and the third amplifier, the third attenuator to reduce the level of the RF signal.

12. The apparatus of claim 1, wherein the first resistive attenuator and the second attenuator are located apart from the receiver signal processing path.

13. The apparatus of claim 1, wherein the first resistive attenuator and the second attenuator provide an attenuation range of at least 20 decibels and enable a reflection coefficient of the receiver signal processing path to be less than approximately −10 decibels.

14. A method comprising:

determining, in a receiver, a signal level associated with a radio frequency (RF) signal received in the receiver;

based at least in part on the signal level associated with the RF signal, first controlling a gain of a first amplifier coupled along a receiver signal processing path of the receiver, the first amplifier to receive and amplify the RF signal, and thereafter controlling a gain of a first resistive attenuator coupled to an input of the first amplifier, until the first amplifier and the first resistive attenuator are turned off; and thereafter controlling a gain of a second attenuator coupled between the input of the first amplifier and an input of a second amplifier coupled in parallel with the first amplifier, and thereafter controlling a gain of the second amplifier.

15. The method of claim 14, further comprising prior to controlling the gain of the first amplifier, controlling a gain of lower frequency gain control circuitry coupled along the receiver signal processing path downstream of the first amplifier.

16. The method of claim 14, further comprising iteratively controlling the gain of the first amplifier and controlling the gain of the first resistive attenuator, until the gain of the first amplifier is exhausted.

17. The method of claim 14, further comprising controlling the gain of the second attenuator and thereafter controlling the gain of the second amplifier, when the signal level associated with the RF signal exceeds a second level greater than a first level.

18. A wireless device comprising:

an antenna to receive and transmit radio frequency (RF) signals of at least a first frequency band and a second frequency band;

switching circuitry coupled to the antenna;

matching network circuitry coupled to the switching circuitry to provide impedance matching; and a multi-band transceiver coupled to the matching network circuitry to process the RF signals of at least the first frequency band and the second frequency band, the multi-band transceiver comprising a first receiver, the first receiver comprising:

a first amplifier adapted along a first receiver signal processing path between a first node and a second node, the first amplifier directly coupled to the first node to receive and amplify a first RF signal of the first frequency band;

a first resistive attenuator coupled between the first node and a reference voltage node, the first resistive attenuator directly coupled to the first node and programmable to reduce a level of the first RF signal of the first frequency band;

a second amplifier coupled in parallel with the first amplifier between the first node and the second node, the second amplifier to receive and amplify the first RF signal of the first frequency band; and a first capacitive attenuator coupled in parallel with the first resistive attenuator between the first node and the reference voltage node, the first capacitive attenuator further coupled to an input of the second amplifier, the first capacitive attenuator programmable to reduce the level of the first RF signal of the first frequency band.

19. The wireless device of claim 18, further comprising a controller to control a first attenuation level of the first resistive attenuator and to control a second attenuation level of the first capacitive attenuator based at least in part on a signal level of the first RF signal of the first frequency band.

20. The wireless device of claim 19, wherein the controller is to first back off a gain of the first resistive attenuator and the first amplifier, and thereafter back off a gain of the first capacitive attenuator and the second amplifier, wherein the first amplifier has a greater gain than the second amplifier.

* * * * *